(12) United States Patent
Burchard et al.

(10) Patent No.: US 9,399,572 B2
(45) Date of Patent: Jul. 26, 2016

(54) MICROELECTROMECHANICAL COMPONENT AND METHOD FOR TESTING A MICROELECTROMECHANICAL COMPONENT

(75) Inventors: Bernd Burchard, Essen (DE); Michael Doelle, Munich (DE)

(73) Assignee: Elmos Semiconductor AG, Dortmund (DE)

(*) Notice: Subject to any disclaimer, the term of this patent is extended or adjusted under 35 U.S.C. 154(b) by 366 days.

(21) Appl. No.: 13/981,506

(22) PCT Filed: Jan. 27, 2012

(86) PCT No.: PCT/EP2012/051336
§ 371 (c)(1),
(2), (4) Date: Jul. 24, 2013

(87) PCT Pub. No.: WO2012/101257
PCT Pub. Date: Aug. 2, 2012

(65) Prior Publication Data
US 2013/0305804 A1    Nov. 21, 2013

(30) Foreign Application Priority Data
Jan. 28, 2011  (EP) ..................... 11152566

(51) Int. Cl.
*G01L 27/00* (2006.01)
*B81B 3/00* (2006.01)
*B81C 99/00* (2010.01)
*G01L 25/00* (2006.01)

(52) U.S. Cl.
CPC ........... *B81B 3/0018* (2013.01); *B81C 99/0045* (2013.01); *G01L 25/00* (2013.01); *G01L 27/007* (2013.01); *B81B 2201/0264* (2013.01)

(58) Field of Classification Search
CPC ............... G01L 25/00; G01L 27/007

USPC ................. 73/1.57; 257/48; 324/158; 48/438
See application file for complete search history.

(56) References Cited

U.S. PATENT DOCUMENTS

| 5,355,712 | A   |    | 10/1994 | Petersen et al. |
|-----------|-----|----|---------|-----------------|
| 8,622,923 | B2  | *  | 1/2014  | Pons et al. ..................... 600/561 |
| 2002/0031849 | A1 | * | 3/2002 | Maruyama et al. ............. 438/14 |
| 2013/0001550 | A1 | * | 1/2013 | Seeger et al. ................... 257/48 |

FOREIGN PATENT DOCUMENTS

| EP | 0 118 605 A2    | 9/1984 |
| WO | 2008/061832 A2  | 5/2008 |

OTHER PUBLICATIONS

Puers R. et al., "On the mechanisms in thermally actuated composite diaphragms", in Sensors and Actuators A: Physical, vol. 67, No. 1-3, Sep. 21, 1997, pp. 13-17 (discussed in the specification and PCT/ISA/210).

* cited by examiner

*Primary Examiner* — Hezron E Williams
*Assistant Examiner* — Nashmiya Fayyaz
(74) *Attorney, Agent, or Firm* — Bejin Bieneman PLC

(57) ABSTRACT

The microelectromechanical component has a semiconductor substrate (1), which has a cavity (2a) formed in the semiconductor substrate. The cavity is covered by a reversibly deformable membrane (2). A sensor (17) for detecting a deformation of the membrane (2) is formed within the region of the membrane (2). A test actuator (28, 29, 30) for deforming the membrane (2) for testing purposes is also arranged within the region of the membrane (2). Finally, the microelectromechanical component has an evaluation and activation unit (41) connected to the sensor (17) and the test actuator (28, 29, 30) for activating the test actuator (28, 29, 30) in order to deform the membrane (2) as a test and for evaluating a measurement signal of the sensor (17) as a sensor detection of a deformation of the membrane (2) as a result of the activation of the test actuator (28, 29, 30).

20 Claims, 4 Drawing Sheets

MICROELECTROMECHANICAL COMPONENT AND METHOD FOR TESTING A MICROELECTROMECHANICAL COMPONENT

The invention generally relates to a microelectromechanical device with special functional elements that allow for a self-testing of this device, and to the associated method for performing a self-test using these special functional elements.

Today, the production testing of micromechanical devices in industrial series production is typically performed as a functional test. It is known already from testing integrated digital circuits that the defect coverage of functional tests, measured using simple stuck-at-0-stuck-at-1 fault models, rarely reaches more than 70%. For this reason, special test methods have been developed that significantly increase the test coverage. The scan-path methodology can be mentioned as an example for the same. A characteristic of present-day tests, which also run much faster, is that it is not the functionality of the system that is tested, but the correct realization thereof. The functional tests are restricted to a few critical cases that are representative of the overall functionality.

These experiences drawn from the production of integrated electronic circuits can be transferred to microelectromechanical systems.

To provide an example of the testing problems of microelectromechanical systems, these will be explained hereunder with reference to a differential pressure sensor for low pressures.

Such an exemplary system has non-linearities. On the one hand, the sensor has an offset that is simple to measure. On the other hand, the sensor is not linear. This requires at least three pressure measurement points. Among others, the sensitivity is also determined thereby. Besides, the offset, as well as the linearity and the sensitivity do not depend linearly on the temperature. This results in at least three temperature points for measuring and calibration.

Setting the at least nine pressure/temperature points requires a significant amount of time, especially in the case of a differential pressure sensor for low pressures, as it is discussed in the present instance. Here, measuring and calibration times in a multi-digit minute range are reached.

US-A-2009/0174418 already discloses a methodology that could serve the above purpose.

However, it merely serves the purpose of determining a membrane thickness. In particular, this disclosure does not allow for a clean distinction between temperature and mechanical stress. Yet, this is necessary to be able to flawlessly perform the above described calibrations.

Further, according to the known methodology, piezo-resistive elements are used to detect the mechanical stress. These have some disadvantages compared to other stress-sensitive elements.

Figure 1:
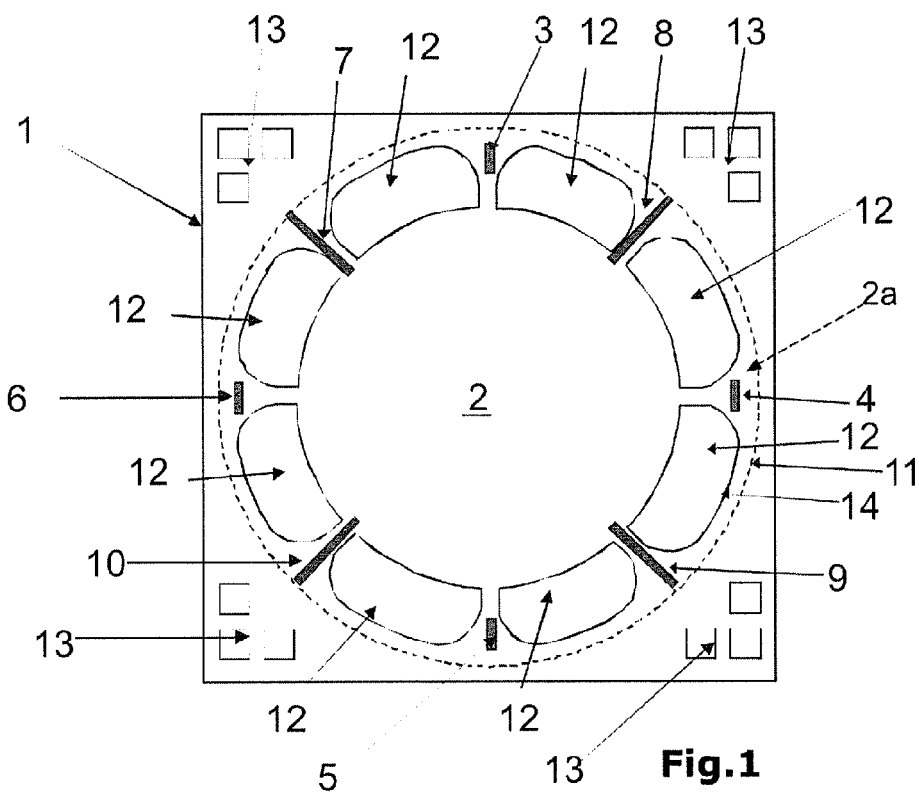

Specifically, as is correctly illustrated in FIG. 1 of US-A-2009/0174418, either a large structure is required that prevents measuring local mechanical stress, or a small piezo-resistive Wheatstone bridge is used which, however, would require a higher current feed and thus induces a higher thermal load on the membrane to be measured.

Another problem arises from the use of the above-mentioned differential pressure sensors in target systems. Typically, such a sensor is mounted in a housing. Given this design, usually done by soldering or gluing to a printed circuit, the mounting process and the later use result in a warping and in distortions of the sensor which result in faulty signals. Therefore, it is feasible to be able to measure a sensor any time after the same has been installed, without having to use any pressure equipment for that purpose.

From WO-A-2008/061832 a microelectromechanical component is known that has a cavity spanned by a membrane on which two piezo resistors are provided as sensors for detecting a deformation, as well as a heating element as an actuator for inducing a deformation of the membrane. While the two sensors are arranged in the edge zone of the membrane and thus in regions of maximized material tensions of the membrane upon a deformation thereof, the actuator is situated at the centre of the membrane, where its thermal coupling to the sensor elements is maximum on average, which may be disadvantageous.

A component similar to the one described above, is also known from DE-A-10 201 001 153. The sensor is designed as a capacitive measuring bridge extending across the membrane. Again, the actuator is a heater arranged at the centre of the membrane.

In U.S. Pat. No. 5,355,712, a pressure or force sensor is described that has a bending beam as the membrane. At its mounting end, the bending beam has an actuator and a sensor element that are arranged in close proximity.

Further micromechanical components are described in EP-A-0 118 605 and in the article by Puers, R. et al.:"on the mechanisms in thermally actuated composite diaphragms", in Sensors and Actuators A 67 (1998), p. 13-17.

Therefore, it is an object of the invention to provide a (in particular high-speed) test for microelectromechanical systems using integrated test aids. These test aids are intended to be able to distinct between mechanical parameters and other parameters such as temperature, for instance. For this reason, they should at least comprise a small actuator that is as compact as possible and at least a sensor that is also as small as possible, which sensor does not itself act as a parasitic actuator, e.g., by thermal load and resulting thermal expansion. Preferably, the test aids should still be usable even after installation and after having been put into operation.

To achieve this object, the invention provides a microelectromechanical component provided with
  a semiconductor substrate,
  a cavity formed in the semiconductor substrate, which cavity is covered by a reversibly deformable membrane,
  wherein the membrane (2) has portions in which material tensions of different strength occur during the deformation of the membrane (2),
  a sensor for detecting a (active and possibly also a passive) deformation of the membrane, and
  a test actuator for deforming the membrane for test purposes,
  wherein the test actuator and the sensor are arranged in those portions of the membrane (i) in which the material tensions are maximal during a deformation of the membrane and (ii) whose mutual distance is the greatest, and,
  in a preferred development of the invention, an evaluation and activation unit for activating the test actuator to deform the membrane as a test and for evaluating a measuring signal of the sensor as a sensor detection of a deformation of the membrane as a result of the activation of the test actuator.

The above-mentioned object is also achieved with a method for testing the functionality of a microelectromechanical component that is provided with
  a semiconductor substrate,
  a cavity formed in the semiconductor substrate, which cavity is covered by a reversibly deformable membrane,
  wherein the membrane (2) has portions in which material tensions of different strength occur during the deformation of the membrane (2), a sensor for detecting a (active and possibly also a passive) deformation of the membrane, and a test actuator for deforming the membrane for test purposes, wherein the test actuator and the sensor are arranged in those portions of the membrane (i) in which the material tensions are maximal during a deformation of the membrane and (ii) whose mutual distance is the greatest, and, wherein in the method of the present invention the test actuator is activated to deform the membrane as a test and, thereafter, it is determined from the measuring signal of the sensor, whether a deformation of the membrane has been detected.

Thus, the invention provides a microelectromechanical component with a membrane, which is reversibly deformable by forces or pressures acting from outside, with a test structure that allows a self-test of the component both in a qualitative and in a mere quantitative manner. The component of the invention allows for a quantitative test insofar as, after manufacture, it is possible to automatically test, whether the membrane is present at all. A qualitative test can be performed with the component of the invention and the method of the invention insofar as the degree of a deformation of the membrane, caused (by the actuator) for test purposes, can subsequently be detected with predeterminable tolerances by measurement techniques. The comparison then shows whether the microelectromechanical component is within a manufacturing tolerance range or not. In this way, good parts can be distinguished from reject parts.

According to the invention, it is the special feature of the microelectromechanical component that the test actuator and the sensor are each arranged in portions of the membrane, where maximum material tensions occur during the deformation thereof, with those portions being selected that are separated by the maximal mutual distance. With a membrane that can be seen as a beam clamped on two or more sides, the test actuator and the sensor are therefore situated, for example, at (diametrically) opposite positions and in the peripheral zone of the membrane. If a plurality of sensors is used, it should be observed, according to the invention, that their respective distance to the test actuator is maximal and, as a consequence, the thermal coupling is minimal under dynamic aspects.

In contrast to prior art, the invention is designed such that the test actuator (e.g. a heater) and the sensor or each of the sensors are respectively arranged in the region where maximum material tensions occur (during a deformation of the membrane), with the test actuator further being positioned as far from the sensor or each sensor as possible. This allows for an optimal decoupling of a thermal wave (i.e. a non-coherent phonon wave), caused by the activity of actuator, from the mechanical wave (structure-borne sound wave, i.e. a coherent phonon wave), which propagate through the membrane at different speeds. Suitably, the wave cause by the actuator is significantly slower than the structure-borne sound wave. With the test actuator configured as a thermoactuator, it is thereby achieved that the thermal wave that propagates through the membrane arrives at the sensor or the sensors later than the mechanical wave, i.e. the structure-borne sound wave, caused by the deformation. For the separation to be performed reliably, the invention provides for a maximization of the distance between the test actuator and the sensor or each of the sensors.

As already mentioned above, the membrane can be understood physically as a bending beam that is clamped at least at opposite sides. However, it is also conceivable that the membrane is clamped on all sides. With a membrane having a rectangular or square shape, seen in top plan view, the test actuator and the sensor are situated at opposite edges, preferably in the central regions of the opposite edges, i.e. in the middle between the corners of the opposite edges. If the membrane is round in shape, the test actuator and the sensor are preferably situated diametrically opposite each other. At the above-mentioned positions of the previously mentioned membrane shapes, the maximum material tension develops upon a deformation of the membrane. In this respect, these positions are well suited for the positioning the test actuator and the sensor as provided by the invention.

An evaluation and activation unit provided for test purposes may be a (integral) part of the microelectromechanical component (on-chip design); however, it is also possible to arrange this evaluation and activation unit externally. In particular, the activation part of this unit exclusively serves testing purposes, while the evaluation structures of this unit are also used when the component serves as a sensor for detecting mechanical forces or pressures.

The approach according to the present invention makes it possible to repeatedly perform self-tests on the microelectromechanical component also during its useful life.

In the context of the present invention, the term "membrane" refers to a reversibly deformable element clamped on one, two, three or even more sides, in which mechanical tensions build due to deformation, which tensions the sensor can detect by measuring.

A wide variety of transducers is eligible as test actuators, which use an activation of an optional type to generate a force to deform (at least locally) the membrane. These transducers may be piezo-resistive, electrostatic-mechanical, magnetostatic, electrodynamic or electrothermal transducers, where specifically electrothermal transducers are advantageous, since these transducers, even with dimensions in the µm range, are able to produce sufficient force to significantly deflect membranes of microelectromechanical components.

Electrothermal transducers suitably comprise a heating element designed as a resistance heating element. Due to the thermally induced local heating of the membrane, tensions are cause in the same which translate as mechanical tensions. These mechanical tensions result in a deformation of the membrane which the sensor can detect by measuring. Better effects are achieved, if a bimetal effect can be produced in the region of the local heating of the membrane. For this purpose, for example, a material layer (e.g. a metal layer) can be provided on the membrane so that two material with different thermal expansion coefficients contact each other in the region of the heating element. Due to the fact that, upon heating, one material expands to a greater extent than the other material, the membrane is deformed. Here, the local heating of the membrane causes a mechanical deformation and thus a structure-borne sound wave that propagates much faster than the subsequent thermal wave. Thus, when the membrane is heated locally, a mechanical deformation occurs first, before the membrane and the material applied thereon are eventually heated to substantially the same temperature level.

Further advantageous embodiments of the invention are mentioned in the dependent claims.

The sensor suitably comprises one or a plurality of resistors or transistors sensitive to material tensions. A thermal influence acting on the sensor during the self-test (given a configuration of the test actuator as a heating element) can be subtracted if a transistor is used as the sensor, since the threshold voltage of the transistor is temperature-dependent. For instance, a piezo-resistive transistor would be suited for use as a transistor. If the temperature behavior of the transistor is known (which, as explained above, is the case with transistors), a parasitic thermal influence on the sensor can be "subtracted" from its measuring signal.

Figure 2:
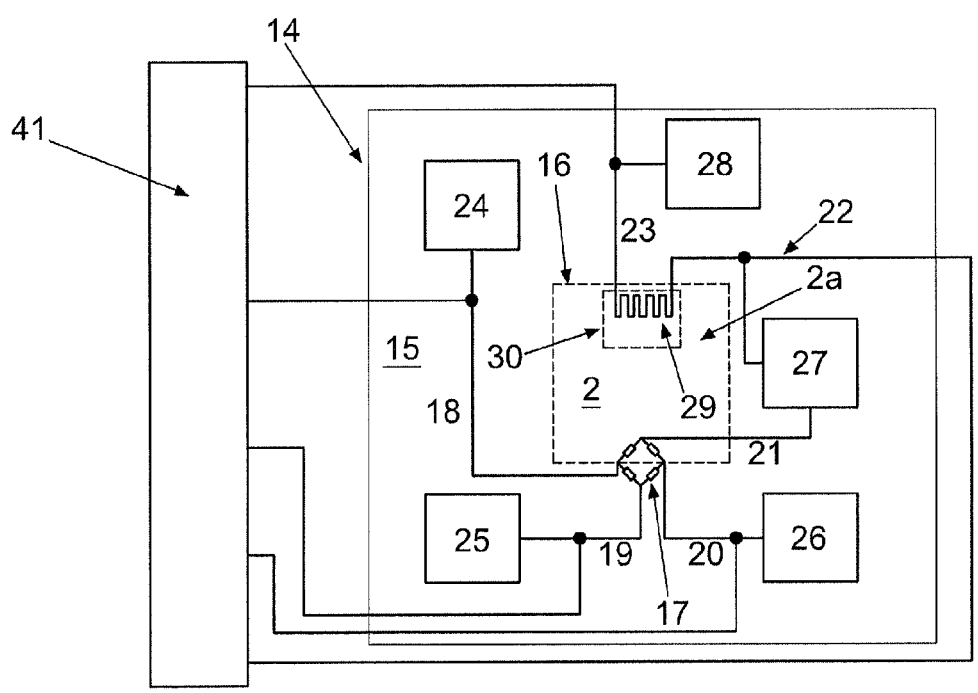
Figure 3:
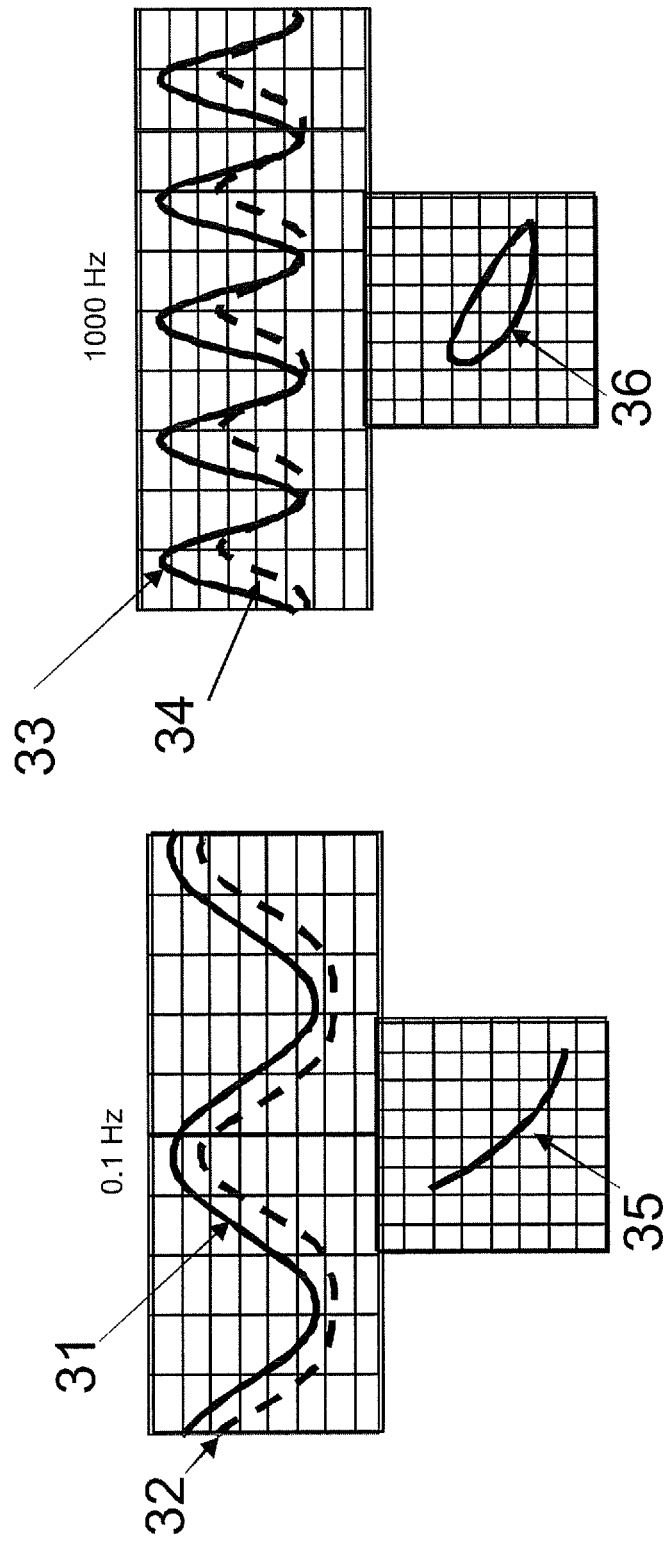
Figure 4:
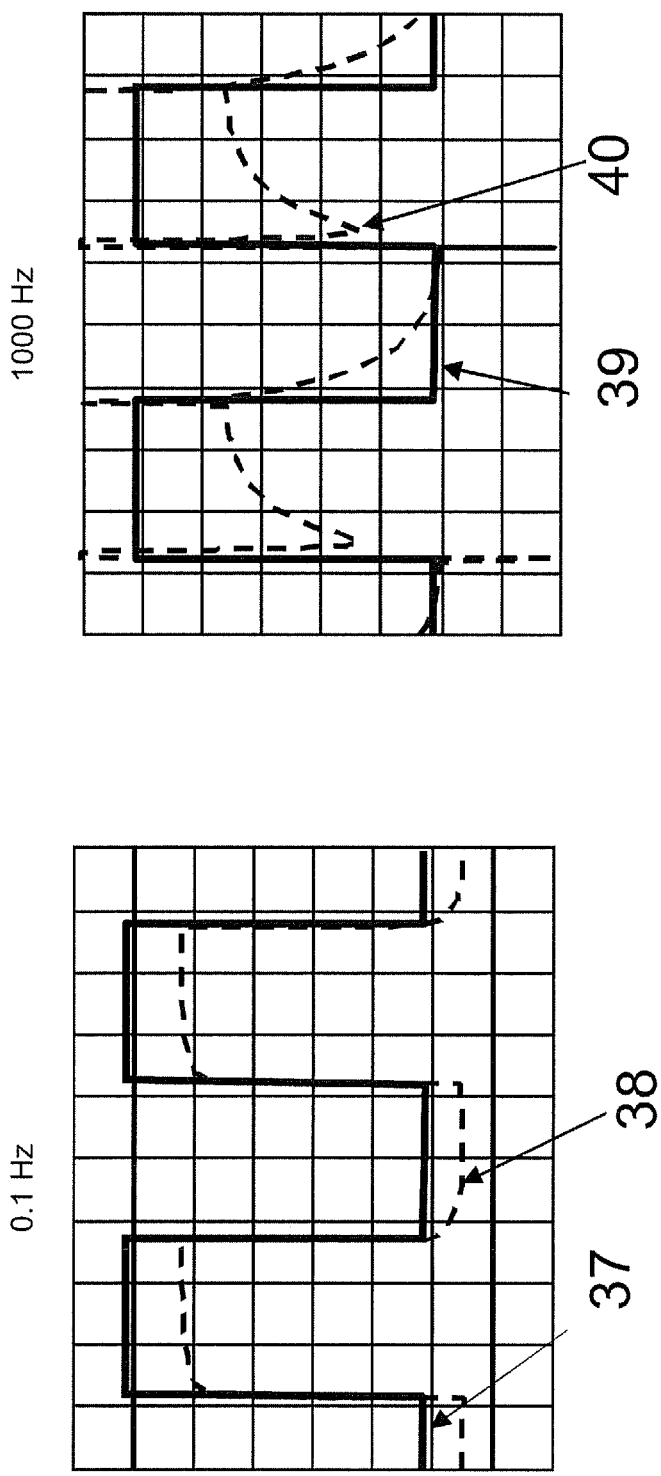
Figure 5:
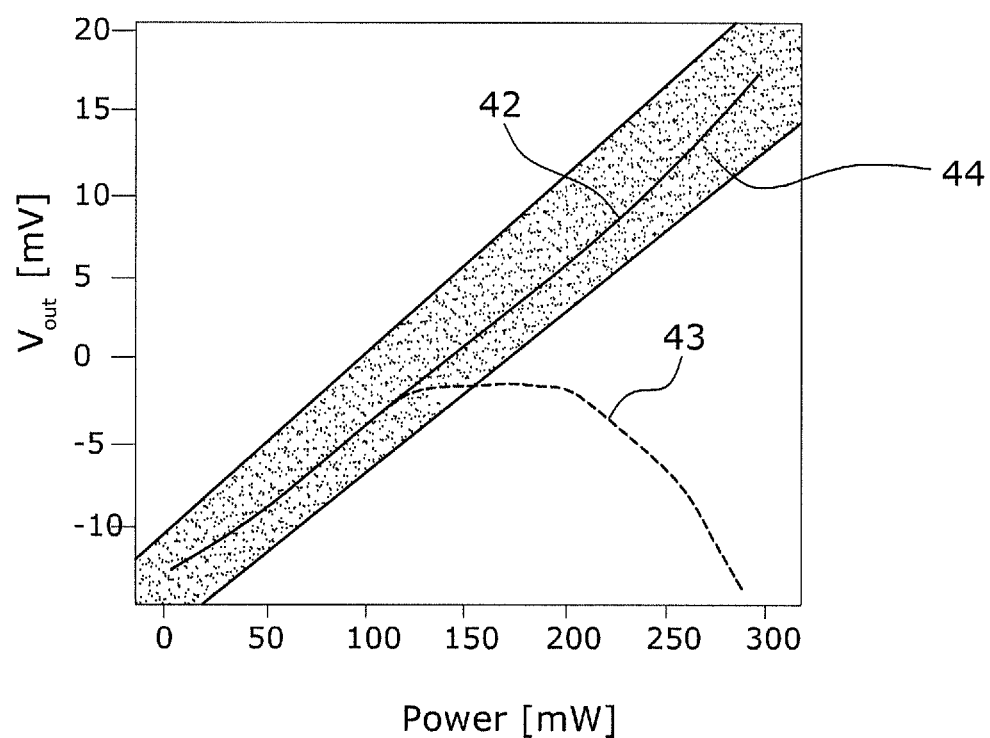

Hereinafter, the invention is described in detail with reference to several embodiments and to the drawing. Specifically, the Figures show:

FIG. 1 an exemplary micromechanical differential pressure sensor in top plan view, FIG. 2 an exemplary micromechanical absolute pressure sensor in top plan view, FIG. 3 the response of the exemplary absolute pressure sensor to an exemplary sinusoidal excitation, FIG. 4 the response of the exemplary absolute pressure sensor to an exemplary square-wave excitation, and FIG. 5 the dependence of the sensor output signal on the actuator stimulation for a good part and a reject part.

The invention will be explained in the context of a differential pressure sensor for low pressures. It can be applied analogously to other micro(-electro-)mechanical systems. If the pressures to be detected by the sensor during normal operation are too low, the times required for the stabilization of the temperatures and the mechanics become too long.

Such a sensor is illustrated in FIG. 1. It is fabricated, e.g., on the basis of a silicon wafer and comprises a semiconductor substrate 1 with an upper surface 1a.

First, in the exemplary case of a pressure sensor for low pressures, the electronic structures are formed on the top surface of the wafer. In this example, a CMOS process is used for this purpose. Other known IC manufacturing technologies are also applicable. The nature of the electronic structure will be explained later.

For the manufacture of the membrane 2 necessary for pressure measurement, a cavity 2a is typically etched into the wafer from the bottom surface of the semiconductor substrate 1, using a DRIE or a plasma etching method. Together with the remaining surface of the wafer, this cavity 2a defines a membrane.

In order to provide the pressure sensor with the abilities of a low-pressure sensor, the membrane is thinned locally by an annular or square race track 12. This race track serves to model the stress field and the temperature conductivity. However, the invention is not restricted to the presence of this race track.

In contrast to known solutions, where the stress field modeling serves the targeted directing of the useful stress generated by the mechanical pressure on the membrane, the stress field modeling in the present example also effects the distribution of the mechanical stress that is induced by additional stress generating test actuators.

An essential problem is posed by the precise manufacture of the actuators. On an unstructured membrane, an erroneous positioning of the sensors, which cannot be excluded because of manufacturing variations, would cause a change in the stress field acting on the sensors. This is avoided by a suitable shaping of the webs. These are shaped such that the stress field does not depend on positional tolerances for the sensors both when it is generated by mechanical pressure on the membrane and when a mechanical stress field is generated by test actuators for the sensors. The shape of the webs is not a part essential to the invention.

With a view to the test actuators, the requirement is somewhat different: a displacement of the test actuators due to manufacturing variations should not result in a change in the mechanical stress field for the sensors.

In this respect, a suitable shape of the webs also leads to a limited, yet sufficient independence of the mechanical stress acting on the sensors from the position of the test actuators when these are activated.

Principally, electro-acoustic-mechanical transducers, magnetostatic transducers, electrodynamic transducers and electrothermal transducers are suited for use as test actuators.

However, in particular electrothermal transducers can develop sufficient force in μm dimensions to immediately cause a significant deflection of the membrane detectable by the sensors. The other transducer principles are suitable only if resonances can be excited that accumulate.

Electric resistors are particularly suited as electrothermal transducers. Since the position relative to the stress guiding structures, which in the exemplary case are formed by the race tracks 12, is of particular importance for the precision of the excitation, it is feasible to define the position, the horizontal shape, the size and the orientation of the race tracks 12, the sensors 3, 4, 5, 6 and the actuators 7, 8, 9, 10 with respect to each other in a common process step. In other words: it is particularly advantageous if the process is a self-adjusting process.

Typically, self-adjusting CMOS manufacturing processes are based on the use of a gate polysilicon layer as a self-adjusting mask for subsequent doting in the CMOS process. This gate poly can also be used for the dimensioning of the resistors and the race tracks.

Only by the self-adjustment element chain comprising an actuator 7, 8, 9, 10, race tracks 12 and a sensor 3, 4, 5, 6, respectively, it is ensured that, within the still remaining manufacturing tolerances, a similar stress field is always applied to the sensors 3, 4, 5, 6, given a correct manufacture.

In order to eliminate the influence of the (vertical) cavity wall 11 which is difficult to adjust with respect to the CMOS structures, it is important to observe a distance between the outer edge, i.e. the outer edge closest to the cavity wall 11, of the race track system 14 formed in the (upper) surface is of the membrane 2 and the cavity wall 11.

In order to obtain an optimal actuator signal, it is feasible to select the depth of the race tracks 12 such that the position of the neutral fiber within the webs having actuators 7, 8, 9, 10 coincides with the depth of the race track 12 when the actuators are activated. In this case, the actuator 7, 8, 9, 10 has a maximum lever with regard to the deflection of the membrane 2.

For a maximum signal, it is feasible to design the actuators 7, 8, 9, 10 as self-adjusting resistors.

Measuring the membrane response is typically, but not necessarily, effected through a Wheatstone bridge. The actuators 7, 8, 9, 10 cause a thermal gradient that renders the method, described, for example, in US-A-2009/0174418, useless for a conventional Wheatstone bridge with piezoresistive resistors respectively at the center of the northern, western, eastern and southern edges of the membrane, since offsets already arise that are exclusively due to an inhomogeneous heat distribution. Thus, a quasi-punctiform Wheatstone bridge would be ideal. In this respect, a MOS transistor field plate with four terminals is particularly useful. If the same is provided with a hole in the middle, this field plate could also be considered a square wiring of four transistors. The great advantage of such a plate is its compact structure and the possibility of a compensation of parasitic elements by analogous computing circuits which do not form a part of the present invention. Generally, it should be noted also in this context that the type of electric wiring and the number of the self-test actuators are not decisive for the invention in its most general form.

Theoretically, the use of a single base element (e.g. a transistor) as a stress-sensitive element would be sufficient. However, this is not optimal for reasons of parasitic influences.

The principal advantage of the use of MOS transistor field plates is that their temperature can be determined based on a threshold voltage which is substantially independent of mechanical stress, but dependent on temperature.

This allows for an exact distinction between mechanical stress and temperature. Accordingly, it is possible to separate the mechanical actuator effect from the thermal actuator effect.

For some applications it may be feasible to couple a flexural tension into the membrane. Since the resistor, which is used as a heater, is close to the surface the expansion at the surface of the membrane is greater than at the lower edge thereof. This effect can even be increased, if the resistor is covered with a material having a higher thermal expansion coefficient than silicon. This is the case, for example, with metal, in particular with an AlSi metallization.

FIG. 2 is a top plan view on an exemplary sensor.

The sensor of FIG. 2 comprises the field plate 17 already mentioned above and acting as the actual sensor element, the plate being connected with four terminal pads 24, 25, 26, 27 via four lines 18, 19, 20, 21. The actuator is configured as a heating element and includes the resistor 29 and the metal cover 30 thereof. It is connected to the respective terminal pads 27, 28 via lines 22, 23. The heating element and the sensor element are positioned on the membrane 16. The sensor 17 and the actuator 28, 29, 30 are further connected with an evaluation and activation unit 41 that may be arranged "on chip", but also externally.

FIG. 3 illustrates the time response behavior of an exemplary sensor of FIG. 2. The faster the actuator activation signal oscillates, the greater the phase shift between the actuator activation 31, 33 and the sensor response 32, 34 becomes.

If the heating element is activated using a jump function, the membrane 2 (in this exemplary case) mechanically bulges upward (downward, if the heating element is arranged on the inner side of the cavity), since the metal has a higher expansion coefficient. If the membrane is already bent in the opposite direction—e.g., due to the pressure prevailing—a bistable state results. The membrane contracts and relaxes abruptly when it jumps into the state in which it is locally bent differently. Thereby, with a fast square excitation 39, a spike behavior 40 occurs (see FIG. 4). This cannot be observed directly at lower frequencies 37, 38.

After some time, the entire membrane has warmed up and expanded. Thereby, the initial bending state becomes energetically more stable and is set.

Accordingly, the frequency and pulse behavior of the mechanical system depends largely on its parameters and thus on their manufacturing variances.

It is an essential step not to try to determine these parameters, but to simply examine the dynamic behavior of a fabricated sensor system to find out whether it corresponds to a behavior known from a good system within the scope of predefined tolerances.

For example, the output signal of a measuring bridge to FIG. 2 can be analyzed in dependence on the actuator state (here, the heating power). FIG. 5 illustrates the response of a respective exemplary sensor as illustrated in FIG. 2. The graph 42 represents the output signal of a properly manufactured and operating sensor in dependence on the heating power. The graph 43 represents the same output signal for a defectively manufactured sensor. In precise characterization, the exemplary defective sensor shows a flawed temperature coefficient of the output signal offset. The reference numeral 44 identifies the tolerance range within which the output signal of a sensor falls that would be qualified as being acceptable.

With such a dynamic measurement it is possible to find a number of important manufacturing flaws of the overall electromechanical system on the wafer, without having to apply different temperatures and pressures in a time-consuming manner. Rather, these could lead to a deviating dynamic-mechanical behavior and a modified temperature conductivity.

Besides, it is possible to further use these measurements provided according to the invention for self-testing purposes even after a sensor of such configuration has been installed in a more complex system.

LIST OF REFERENCE NUMERALS 1 semiconductor substrate (e.g. silicon wafer)
1a is upper side of the semiconductor substrate
2 membrane with central boss
2a cavity below membrane
3 piezo-resistor of Wheatstone bridge in north position
4 piezo-resistor of Wheatstone bridge in east position
5 piezo-resistor of Wheatstone bridge in south position
6 piezo-resistor of Wheatstone bridge in west position
7 heater in north-west position
8 heater in north-east position
9 heater in south-east position
10 heater in south-west position
11 edge of the cavity under the membrane
12 thinning of the membrane for the control of the mechanical stress field within the membrane (race track)
13 exemplary terminals
14 outer edge of the race track; the same should observe a minimum distance from the cavity wall 14
15 ultra-small pressure sensor seen in top plan view on the membrane
16 cavity wall below the membrane (covered)
17 FET bridge for detecting mechanical stress
18 connecting line to output pad 24
19 connecting line to GND terminal 25
20 connecting line to the second output pad 26
21 connecting line to the VDD terminal 27
22 connection between the thermal actuator 29 and the VDD terminal 27
23 connection between the thermal actuator 29 and the actuator terminal 28
24 Vsig− signal output
25 GND terminal
26 Vsig+ signal output
27 VDD supply voltage terminal
28 actuator (heater) terminal
29 actuator (polysilicon heater)
30 actuator strengthener (metal plate)
31 oscillogram of the heating voltage of the sensor of FIG. 2 (axis x representing time) at 100 mHz sinusoidal excitation
32 oscillogram of the bridge output voltage of the sensor of FIG. 2 (axis x representing time) at 100 mHz and activation through signal 31
33 oscillogram of the heating voltage of the sensor of FIG. 2 (axis x representing time) at 1 kHz sinusoidal excitation
34 oscillogram of the bridge output voltage of the sensor of FIG. 2 (axis x representing time) at 1 kHz and activation through signal 34; signal 34 is phase-shifted with respect to signal 33
35 x-y oscillogram associated with signals 31 and 32 (no sweep)
36 x-y oscillogram associated with signals 34 and 35 (no sweep)

37 oscillogram of the heating voltage of the sensor of FIG. 2 (axis x representing time) at 100 mHz square-wave excitation 38 oscillogram of the bridge output voltage of the sensor of FIG. 2 (axis x representing time) at 100 mHz and activation through signal 37

39 oscillogram of the heating voltage of the sensor of FIG. 2 (axis x representing time) at 1 kHz square-wave excitation 40 oscillogram of the bridge output voltage of the sensor of FIG. 2 (axis x representing time) at 1 kHz and activation through signal 39; signal 40 is phase-shifted with respect to signal 39; further, a spike occurs 41 evaluation and activation unit 42 characteristic of the sensor of FIG. 2: output voltage in dependence on the heating power induced 43 characteristic of the sensor of FIG. 2 with manufacturing defects: output voltage in dependence on the heating power induced 44 tolerance range

The invention claimed is:

1. A microelectromechanical component comprising
a semiconductor substrate,
a cavity formed in the semiconductor substrate, which cavity is covered by a reversibly deformable membrane,
wherein the membrane has portions in which material tensions of different strength occur during the deformation of the membrane,
a sensor for detecting a deformation of the membrane, and
a test actuator for deforming the membrane for test purposes,
wherein the membrane, on an edge that comprises at least two opposite edge portions, is connected to the semiconductor substrate,
wherein the material tensions generated in the membrane across the whole extension of the membrane during deformation of the membrane are greater along the edge of the membrane than at other portions of the membrane,
wherein the test actuator is arranged at a site of a first edge portion of the membrane in which the material tension is maximal during deformation of the membrane, wherein the sensor is arranged at a site of a second edge portion of the membrane, and
whereby a distance between the test actuator and the sensor along the edge of the membrane is maximized.

2. The microelectromechanical component of claim 1, wherein the sensor is arranged opposite the acuator.

3. The microelectromechanical component of claim 1, wherein the test actuator is an electrothermal transducer for the local heating of the membrane.

4. The microelectromechanical component of claim 3, wherein the electrothermal transducer is a heating element including a resistance heating element for heating a material layer formed on the membrane the material layer including one of a metal layer and a layer also including metal of the heating element, wherein the material layer and the semiconductor substrate have different thermal expansion coefficients.

5. The microelectromechanical component of claim 1, wherein the test actuator includes at least one of an electrostatic-mechanical a magnetostatic-mechanical and an electrodynamic transducer.

6. The microelectromechanical component of claim 1, wherein the sensor includes a piezo-resistive transistor.

7. The microelectromechanical component of claim 1, including an evaluation and activation unit, connected with the sensor and the test actuator, for activating the test actuator to deform the membrane as a test and for evaluating a measuring signal of the sensor as a sensor detection of a deformation of the membrane as a result of the activation of the test actuator.

8. A method for testing the functionality of a microelectromechanical component that is provided with
a semiconductor substrate,
a cavity formed in the semiconductor substrate, which cavity is covered by a reversibly deformable membrane,
wherein the membrane has portions in which material tensions of different strength occur during the deformation of the membrane,
a sensor for detecting a deformation of the membrane, and
a test actuator for deforming the membrane for test purposes,
wherein the membrane, on an edge that comprises at least two opposite edge portions, is connected to the semiconductor substrate,
wherein the material tensions generated in the membrane across the whole extension of the membrane during deformation of the membrane are greater along the edge of the membrane than at other portions of the membrane,
wherein the test actuator is arranged at a site of a first edge portion of the membrane in which the material tension is maximal during deformation of the membrane,
wherein the sensor is arranged at a site of a second edge portion of the membrane in which the material tension is maximal during deformation of the membrane, and
whereby a distance between the test actuator and the sensor along the edge of the membrane is maximized,
wherein in the method
the test actuator is activated to deform the membrane as a test and, thereafter, an evaluation unit included in the microelectromechanical component determines from a measuring signal of the sensor, whether a deformation of the membrane has been detected.

9. The method of claim 8, wherein a degree of a deformation of the membrane is determined from the measuring signal of the sensor and that the degree of deformation is compared to a predeterminable target deformation.

10. The microelectromechanical component of claim 3, wherein the sensor includes a piezo-resistive transistor.

11. The microelectromechanical component of claim 4, wherein the sensor includes a piezo-resistive transistor.

12. The microelectromechanical component of claim 5, wherein the sensor includes a piezo-resistive transistor.

13. The microelectromechanical component of claim 3, including an evaluation and activation unit, connected with the sensor and the test actuator, for activating the test actuator to deform the membrane as a test and for evaluating a measuring signal of the sensor as a sensor detection of a deformation of the membrane as a result of the activation of the test actuator.

14. The microelectromechanical component of claim 4, including an evaluation and activation unit, connected with the sensor and the test actuator, for activating the test actuator to deform the membrane as a test and for evaluating a measuring signal of the sensor as a sensor detection of a deformation of the membrane as a result of the activation of the test actuator.

15. The microelectromechanical component of claim 5, including an evaluation and activation unit, connected with a sensor and the test actuator, for activating the test actuator to deform the membrane as a test and for evaluating a measuring signal of the sensor as a sensor detection of a deformation of the membrane as a result of the activation of the test actuator.

16. The microelectromechanical component of claim 6, including an evaluation and activation unit, connected with the sensor and the test actuator, for activating the test actuator to deform the membrane as a test and for evaluating a measuring signal of the sensor as a sensor detection of a deformation of the membrane as a result of the activation of the test actuator.

17. The microelectromechanical component of claim 6 wherein the piezo-resistive transistor includes at least one of a MOS or a FET transistor.

18. A microelectromechanical component comprising:
   a semiconductor substrate,
   a cavity formed in the semiconductor substrate, which cavity is covered by a reversibly deformable membrane, the cavity defined by an outer edge having one or more first portions and one or more second portions, wherein the membrane includes portions in which material tension strengths differ from material tension strengths in other portions during the deformation of the membrane,
   wherein the material tensions generated in the membrane during deformation of the membrane are greater along the edge of the membrane than at other portions of the membrane,
   wherein one or more test actuators are arranged respectively at one or more first edge portions in which the material tension is maximal during deformation of the membrane,
   wherein one or more sensors are arranged respectively at one or more second edge portions of the membrane in which the material tension is maximal during deformation of the membrane, and
   further wherein the one or more first edge portions and one or more second edge portions are arranged alternately and evenly-spaced along the outer edge such that a distance between each sensor and each adjacent actuator is maximized.

19. The microelectromechanical component of claim 18 wherein:
   the membrane is substantially circular.

20. The micromechanical component of claim 18 wherein:
   the membrane is substantially in the form of a rectangle having a first side and a second side opposite the first side,
   the first edge portion is arranged in a central portion of the first side, and
   the second edge portion is arranged in a central portion of the second side.

* * * * *